(12) United States Patent
Lin

(10) Patent No.: US 7,822,402 B2
(45) Date of Patent: Oct. 26, 2010

(54) METHOD OF PERFORMING FREQUENCY CONVERSION AND ASSOCIATED FREQUENCY CONVERTER

(75) Inventor: Chia-Liang Lin, Union City, CA (US)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 12/577,207

(22) Filed: Oct. 11, 2009

(65) Prior Publication Data

US 2010/0029238 A1    Feb. 4, 2010

Related U.S. Application Data

(62) Division of application No. 11/419,507, filed on May 21, 2006, now Pat. No. 7,620,381.

(51) Int. Cl.
    *H04B 1/26* (2006.01)
(52) U.S. Cl. .................................................. 455/323
(58) Field of Classification Search ................ 455/313, 455/323, 324, 325, 326, 333, 334
    See application file for complete search history.

(56) References Cited

U.S. PATENT DOCUMENTS

| 4,468,784 | A | 8/1984 | Jagnow | |
|---|---|---|---|---|
| 4,628,270 | A | 12/1986 | Roberts | |
| 5,697,091 | A | 12/1997 | Hirschenberger | |
| 6,041,223 | A | 3/2000 | Thomas | |
| 6,845,233 | B2 | 1/2005 | Louis | |
| 6,933,766 | B2 * | 8/2005 | Khlat et al. | 327/359 |
| 7,130,604 | B1 * | 10/2006 | Wong et al. | 455/302 |
| 7,190,943 | B2 * | 3/2007 | Davis | 455/313 |
| 7,457,606 | B2 * | 11/2008 | Kim | 455/323 |
| 7,471,134 | B2 | 12/2008 | Dornbusch | |
| 2005/0233723 | A1 * | 10/2005 | Gomez et al. | 455/323 |
| 2005/0239430 | A1 * | 10/2005 | Shah | 455/326 |
| 2006/0160518 | A1 * | 7/2006 | Seendripu et al. | 455/323 |

\* cited by examiner

*Primary Examiner*—Blane J Jackson
(74) *Attorney, Agent, or Firm*—Winston Hsu; Scott Margo; Min-Lee Teng

(57) ABSTRACT

A method of performing frequency conversion and associated frequency converter are provided. The method includes: receiving an input signal and a plurality of periodic ternary signals of the same frequency but different timings; generating a plurality of conversion signals using a plurality of conversion paths in response to the input signal and states of said periodic ternary signals; and summing the conversion signals to generate an output signal.

20 Claims, 9 Drawing Sheets

(A)    (B)

waveform of $G_1*M_1+G_2*M2+G_3*M_3$ (B)

METHOD OF PERFORMING FREQUENCY CONVERSION AND ASSOCIATED FREQUENCY CONVERTER

CROSS REFERENCE TO RELATED APPLICATIONS

This application is a divisional application and claims the benefit of U.S. application Ser. No. 11/419,507, which was filed on May 21, 2006 and is entitled "TRI-STATE CHOPPER FOR FREQUENCY CONVERSION".

BACKGROUND OF THE INVENTION

1. Field of the Invention

The present invention relates to tri-state chopper circuit and its application to frequency conversion, in particular to frequency conversion that suppresses harmonics mixing.

2. Description of the Prior Art

Direct conversion receiver is well known in prior art. FIG. 1 depicts a functional block diagram of a typical direct conversion receiver 100, which comprises: a pre-filter 110; a LNA (low-noise amplifier) 120; an in-phase (I) path comprising a first mixer 130_I, a first LPF (low pass filter) 140_I, and a first ADC (analog-digital converter) 150_I; and a quadrature (Q) path comprising a second mixer 130_Q, a second LPF (low pass filter) 140_Q, and a second ADC (analog-digital converter) 150_Q. Pre-filter 110 performs a preliminary filtering on a RF (radio frequency) input RF_IN and passes an output to LNA 120, which performs a low-noise amplification on the output of pre-filter 110 and generates a RF signal 122 provided as an input to both the in-phase (I) path and the quadrature (Q) path. The in-phase path receives the RF signal 122 and converts it into a first digital baseband signal BB_I by mixing the RF signal 122 with an in-phase clock LO_I using mixer 130_I, filtering an output of mixer 130_I using LPF 140_I, and converting the output of LPF 140_I into the digital baseband signal BB_I using ADC 150_I. The quadrature path receives the RF signal 122 and converts it into a second digital baseband signal BB_Q by mixing the RF signal 122 with a quadrature clock LO_Q using mixer 130_Q, filtering an output of mixer 130_Q using LPF 140_Q, and converting the output of LPF 140_Q into the digital baseband signal BB_Q using ADC 150_Q. In general, the input signal RF_IN is a wide-band signal that contains many spectral components, among which only a narrow-band component is to be selected. To satisfy the condition of "direct conversion," both the in-phase clock LO_I and the quadrature clock LO_Q must have the same frequency as the desired narrow-band component, and also the phase difference between the in-phase clock LO_I and the quadrature clock LO_Q must be 90 degrees.

Although the principle of direct conversion receiver has been well known in prior art, it is very difficult to apply direct conversion to a TV tuner due to a problem known as "harmonic mixing" caused by an undesired but inevitable mixing within the two mixers (130_I and 130_Q). In particular, a practical mixer is subject to generating spurious mixing products among its input RF signal and odd-order harmonics of the LO clock. For instance, a tuner needs to be tuned to select a channel among a plurality of channels ranging from 47 MHz to 862 MHz. If the tuner were tuned to 100 MHz using direct conversion architecture, both LO clocks (LO_I and LO_Q) must also be 100 MHz in frequency. While the desired channel (at 100 MHz) can be successfully converted into the two baseband signals, the signal of an undesired channel at 300 MHz will also be converted and become a part of the two baseband signals, since the undesired signal at 300 MHz will also be mixed with the $3^{rd}$ harmonics of the LO signals. A mixer can be implemented either as a "multiplying mixer" or a "switching mixer"; neither is immune from the "harmonic mixing" problem.

What is needed is a method to perform frequency conversion without having spurious mixing problems caused by harmonic mixing.

SUMMARY OF THE INVENTION

In an embodiment, a frequency converter is disclosed, the frequency converter receiving an input signal and a periodic ternary control signal and generating an output signal, wherein the output signal tracks the input signal in both magnitude and sign when the periodic ternary control signal is in a first state, the output signal tracks the input signal in magnitude but has an opposite sign when the periodic ternary control signal is in a second state, and the output signal is set to zero when the periodic ternary control signal is in a third state.

In an embodiment, a frequency converter is disclosed, the frequency converter comprising a plurality of frequency conversion paths for receiving a common input signal and generating a plurality of conversion signals, respectively, and a summing circuit for summing all of said conversion signals to generate an output signal, wherein at least one of said frequency conversion paths comprises a tri-state chopper (TSC) circuit for receiving a ternary signal and generating a conversion signal, wherein the conversion signal is proportional to the common input signal when the ternary signal is in a first state, the conversion signal is proportional to an inversion of the common input signal when the ternary signal is in a second state, and the conversion signal is set to zero when the ternary signal is in a third state.

In an embodiment, a quadrature frequency converter is disclosed, the quadrature frequency converter comprising: (a) a first frequency converter comprising: a first group of parallel conversion paths for receiving an input signal and a first group of periodic ternary signals and converting the input signal into a first group of conversion signals; and a first summing circuit for summing the first group of conversion signals to generate a first output signal, and (b) a second frequency converter comprising: a second group of parallel conversion paths for receiving the input signal and a second group of periodic ternary signals and converting the input signal into a second group of conversion signals; and a second summing circuit for summing the second group of conversion signals to generate a second output signal.

In an embodiment, a method of performing frequency conversion is disclosed, the method comprising: receiving an input signal and a periodic ternary signal; and generating an output signal in response to the input signal and a state of the periodic ternary signal.

In an embodiment, a method of performing frequency conversion is disclosed, the method comprising: receiving an input signal and a plurality of periodic ternary signals of the same frequency but different timings; generating a plurality of conversion signals in response to the input signal and states of said periodic ternary signals; and summing all the conversion signals to generate an output signal.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a tri-state chopper circuit and its application to harmonic rejection frequency conversion. While the specifications described several example embodiments of the invention considered best modes of practicing the invention, it should be understood that the invention can be implemented in many way and is not limited to the particular examples described below or to the particular manner in which any features of such examples are implemented. In other instances, well-known details are not shown or described to avoid obscuring aspects of the invention.

Tri-State Chopper

Figure 1:
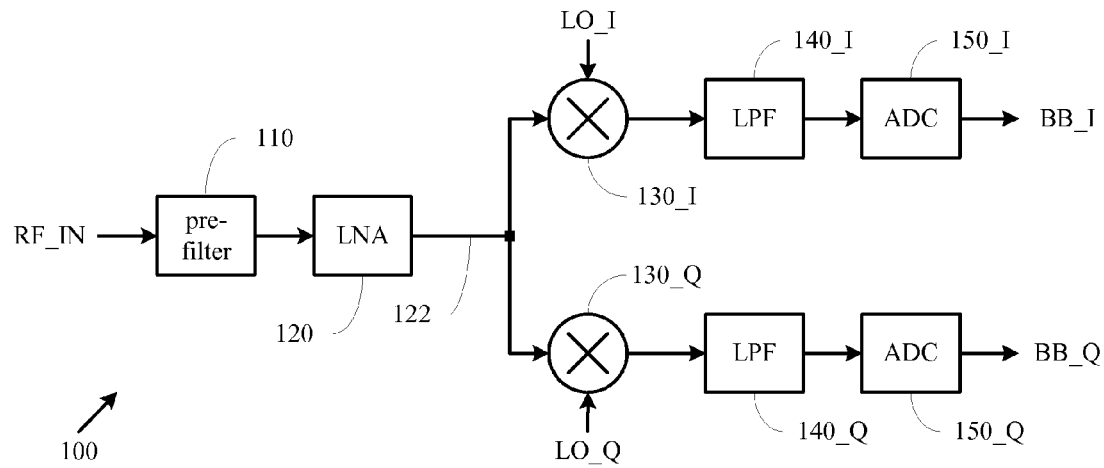
FIG. 1 shows a block diagram of a prior art direct conversion receiver.
Figure 2:
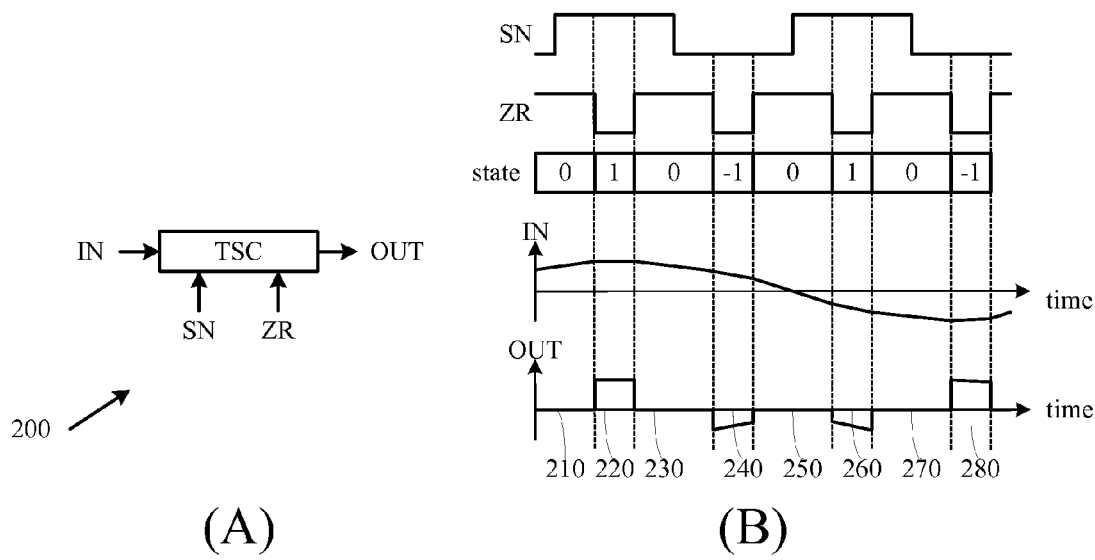
FIG. 2 shows a symbol (A) and an exemplary timing diagram (B) for a tri-state chopper (TSC) circuit.

A tri-state chopper (TSC) receives an input signal and a ternary control signal and generates an output signal. A ternary control signal has three states, say "1," "−1," and "0." In a first state ("1"), the output signal tracks the input signal in both magnitude and sign; in a second state ("−1"), the output signal tracks the input signal in magnitude but has an opposite sign; and in a third state ("0"), the output signal is zero, regardless of the input signal. A ternary control signal can be represented by two or more binary control signals. In a preferred embodiment, two logical (binary) signals SN (which stands for "sign") and ZR (which stands for "zero") are used to represent a ternary signal. As shown in FIG. 2(A), a tri-state chopper (TSC) circuit 200 receives an input signal IN and a ternary control signal represented by two control signals, SN and ZR, and generates an output signal OUT. Both SN and ZR are logical signals, and each has two logical states: high and low. The ternary signal is in the first state ("1") when SN is high but ZR is low; in this case the output OUT follows the input IN in both magnitude and sign, i.e. OUT is proportional to IN. The ternary signal is in the second state ("−1") when both SN and ZR are low; in this case the output OUT follows the input IN in magnitude and has an opposite sign, i.e. OUT is proportional to an inversion of IN. The ternary signal is in the third state ("0") when ZR is high; in this case the output OUT is zero, regardless of the input signal. An exemplary timing diagram of a TSC circuit is shown in FIG. 2(B). During time spans 210, 230, 250, and 270, ZR is high and thus the ternary control signal is in the third state ("0"); therefore the output OUT is zero. During time spans 220 and 260, ZR is low but SN is high and thus the ternary control signal is in the first state ("1"); therefore, the output OUT follows the input IN in both magnitude and sign. During time spans 240 and 280, both ZR and SN are low and thus the ternary control signal is in the second state ("−1"); therefore, the output OUT follows the input IN in magnitude but has an opposite sign.

Throughout this invention, the two control signals SN ("sign") and ZR ("zero") along with their encoding scheme described above are used to represent a ternary control signal for controlling a TSC circuit. However, it must be understood that, for those of ordinary skill in the art, a ternary control signal can be represented by many alternative encoding schemes. In particular, two binary signals can represent up to four distinct states, but a ternary control signals only has three states. Therefore, one can freely choose any scheme that maps the four distinct states represented by the two binary signals into the three distinct states represented by the ternary control signal. In an alternative embodiment, one may choose to use three binary signals $C_1$, $C_{-1}$, and $C_0$ to represent a ternary control signal. At any time instant, one of the three binary signals must be high and the other two must be low. The ternary control signal is in the first state when $C_1$ is high and both $C_{-1}$, and $C_0$ are low; the ternary control signal is in the second state when $C_{-1}$ is high and both $C_1$ and $C_0$ are low; and the ternary control signal is in the third state when $C_0$ is high and $C_1$, and $C_{-1}$ are low.

Figure 3:
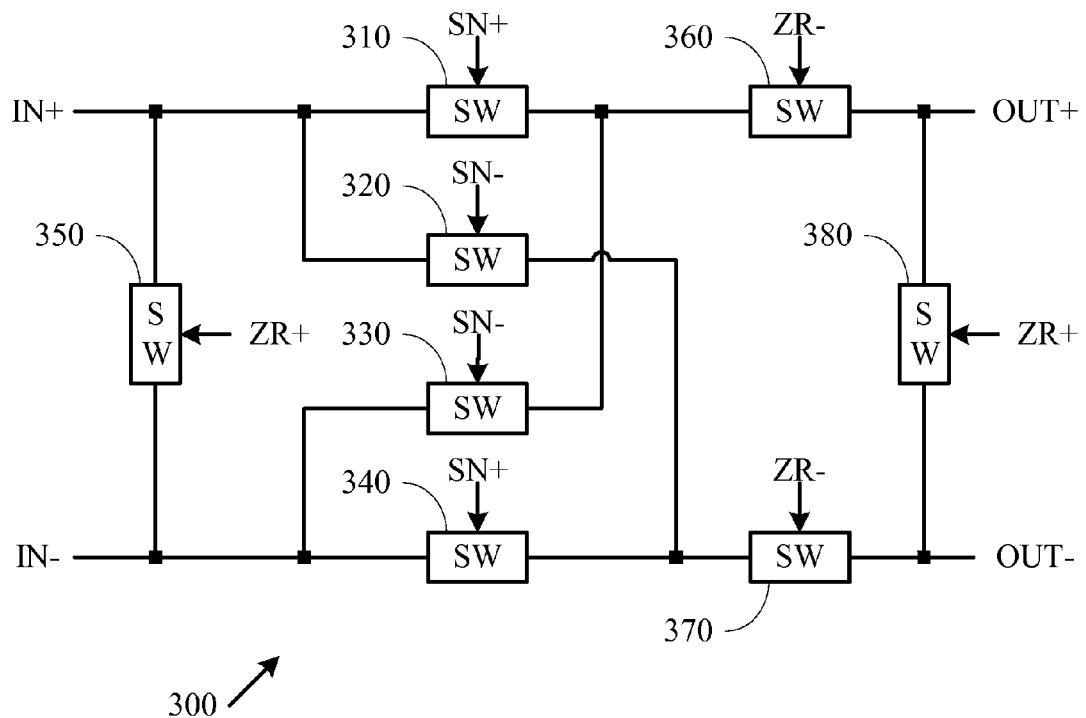
FIG. 3 shows an exemplary embodiment of a TSC circuit.

FIG. 3 shows an exemplary embodiment for a TSC circuit 300 comprising a plurality of switches SW 310-380. Here, a differential circuit embodiment is used, where the input is embodied by a differential signal IN+/−, the output is embodied by a differential signal OUT+/−, the first control signal SN is embodied by SN+ and its logical inversion SN−, and the second control signal ZR is embodied by ZR+ and its logical inversion ZR−. Each switch (310-380) has two states: "closed" and "open," controlled by a logical signal; the switch is closed when the controlling logical signal is high, and is open otherwise. In a first state where ZR is low (i.e., ZR+ is logically low and ZR− is logically high) and SN is high (i.e., SN+ is logically high and SN− is logically low), IN+ is coupled to OUT+ through SW 310 and 360, while IN− is coupled to OUT− through SW 340 and 370. In this first state, the output follows the input without a polarity flip. In a second state where ZR is low (i.e., ZR+ is logically low and ZR− is logically high) and SN is also low (i.e., SN+ is logically low and SN− is logically high), IN+ is coupled to OUT− through SW 320 and 370, while IN− is coupled to OUT+ through SW 330 and 360. In this second state, the output follows the input but has a polarity reversion. In a third state where ZR is high (i.e., ZR+ is logically high and ZR− is logically low), the differential input IN+/− and the differential output OUT+/− are decoupled from each other, IN+ is coupled to IN− through SW 350, and OUT+ is coupled to OUT− through SW 380. In this third state, the differential output is effectively zero. Implementation of a switch circuit, e.g. using a MOSFET (metal-oxide semiconductor field effect transistor), is well known to those of ordinary of skill in the art and thus not described here.

Tri-State Chopper Based Frequency Conversion

Figure 4:
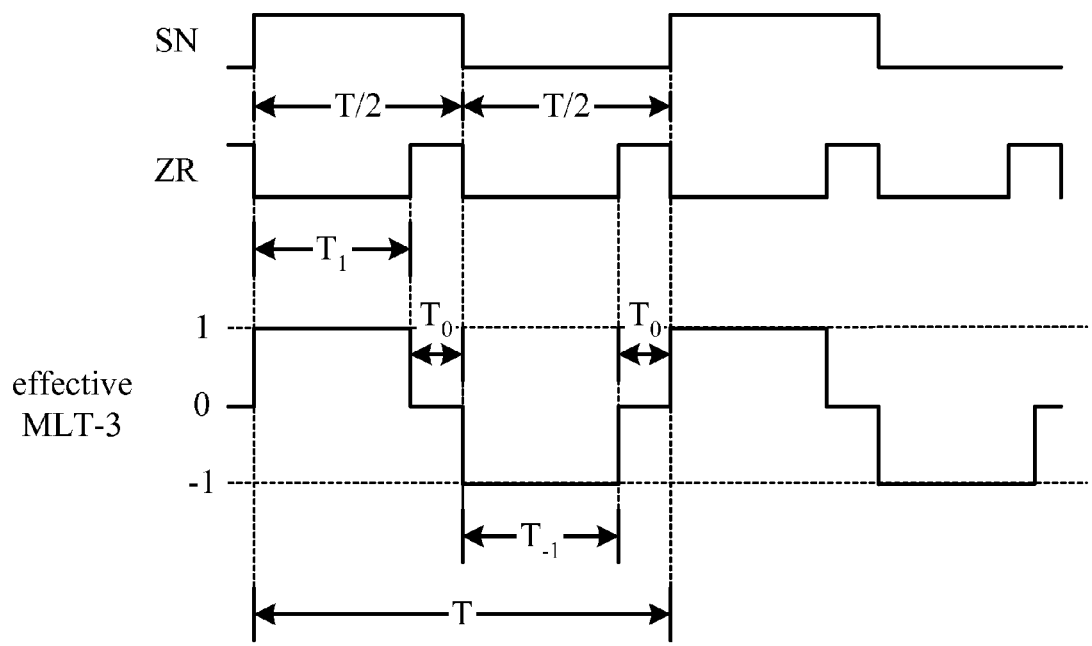
FIG. 4 shows an exemplary MLT-3 (multi-level transmit, 3-level) waveform implied in a TSC circuit.

A TSC circuit can be used to perform a frequency conversion if its ternary control signal is periodic, i.e. both control signals SN and ZR are periodic in the preferred encoding scheme. However, a TSC circuit, when used as an apparatus for performing frequency conversion, can be tailored to have a better harmonic suppression than a prior art mixer. A prior art mixer, which receives an input signal and a LO (local oscillator) signal and generates an output signal, is analogous to a two-state chopper circuit, where the output follows the input but will be conditionally flipped (in terms of signal polarity) unless the LO signal is high. In a prior art mixer, the output signal is equivalent to the input signal multiplied with a square wave, whose frequency is the same as the LO signal's frequency. Mathematically the following Fourier series can represent a square wave of period T of 50% duty-cycle:

$$SQ(t) = \frac{4}{\pi} \begin{pmatrix} \sin(\omega t) + \frac{1}{3} \cdot \sin(3\omega t) + \frac{1}{5} \cdot \sin(5\omega t) + \frac{1}{7} \cdot \\ \sin(7\omega t) + \frac{1}{9} \cdot \sin(9\omega t) + \frac{1}{11} \cdot \sin(11\omega t) + \ldots \end{pmatrix}$$

where $\omega = 2\pi/T$. A square wave, therefore, has very strong $3^{rd}$ order and $5^{th}$ order harmonics. On the other hand, a TSC circuit has an extra degree of freedom for a user to manipulate the relative strengths of harmonics mixings thanks to using two control signals SN and ZR (as opposed to using only one control signal LO in a prior art mixer.). In particular, when SN is a square wave of period T and ZR is a rectangular wave of period T/2, the output signal OUT is equivalent to the input signal IN multiplied with a MLT-3 (multi-level transmit, 3-level) wave of period T. FIG. 4 shows an exemplary MLT-3 wave corresponding to a case where SN is a square wave of period T and ZR is a rectangular wave of period T/2. Here, the MLT-3 wave has three levels: "1" (when SN=1 and ZR=0), "−1" (when SN=0 and ZR=0), and "0" (when ZR=1). Also, the MLT-3 wave exhibits a periodic pattern: 0, 1, 0, −1, 0, 1, 0, −1, and so on. The period is T; the durations each time it stays at the three levels "1," "0," and "−1" are $T_1$, $T_0$, and $T_{-1}$, respectively. To have a good even-order harmonic suppression, one needs to have $T_1 = T_{-1}$. The relative strength of any particular odd order harmonics of interest to the fundamental frequency (i.e., 1/T) can be suppressed by choosing a proper ratio between $T_1$ and T. In a special case of particular interest where $T_1/T = 1/3$ (and also $T_{-1}/T = 1/3$ and $T_0/T = 1/6$), the MLT-3 wave can be represented by the following Fourier series:

$$MLT3(t) = \frac{2\sqrt{3}}{\pi} \begin{pmatrix} \sin(\omega t) - \frac{1}{5} \cdot \sin(5\omega t) - \frac{1}{7} \cdot \sin(7\omega t) + \\ \frac{1}{11} \cdot \sin(11\omega t) + \frac{1}{13} \cdot \sin(13\omega t) + \ldots \end{pmatrix}$$

Here, the $3^{rd}$ order, the $9^{th}$ order, and in general any 3K-th order (where K is an integer) harmonics are all zero. Therefore, a TSC circuit offers a flexibility of a selective harmonics rejection that is not possible in a prior art mixer.

Choosing $T_1/T = 1/3$ (and also $T_{-1}/T = 1/3$ and $T_0/T = 1/6$) results in a perfect rejection of any 3K-th order harmonics, and therefore is a very favorable choice. In many applications, it is desirable to completely reject the $5^{th}$ order, the $7^{th}$ order, and/or some other odd order harmonics as well. Using a plurality of parallel TSC circuits, each performing a certain MLT-3 multiplication, one can fulfill this objective.

Tri-State Chopper Based Harmonics Rejection Frequency Conversion

Figure 5A:
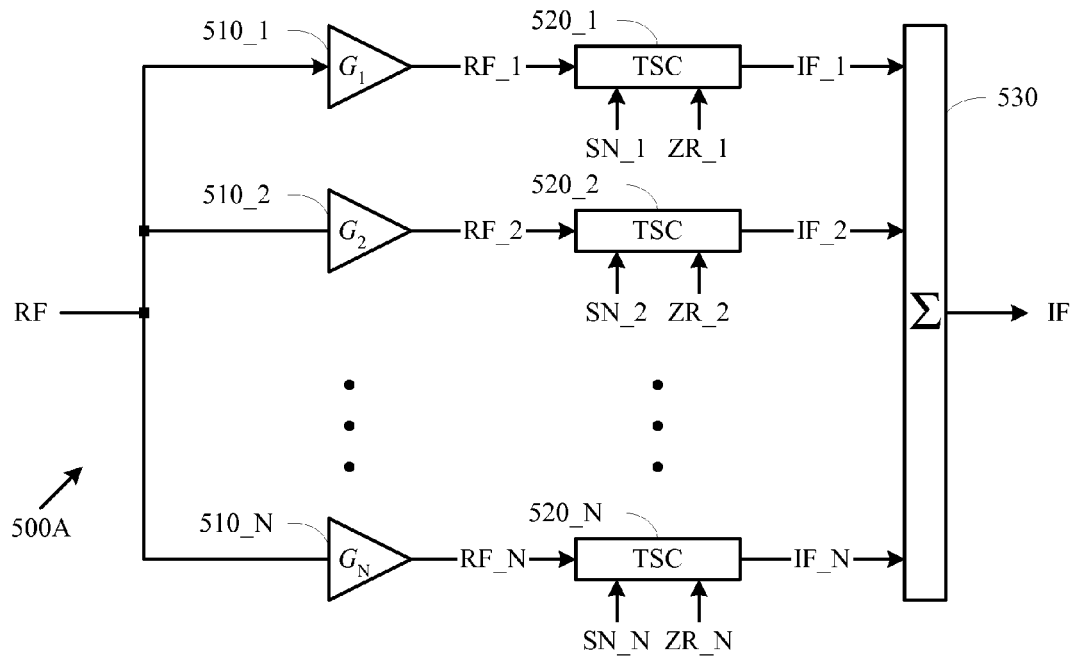
FIG. 5A shows an embodiment of a frequency converter using a plurality of TSC circuits.
Figure 5B:
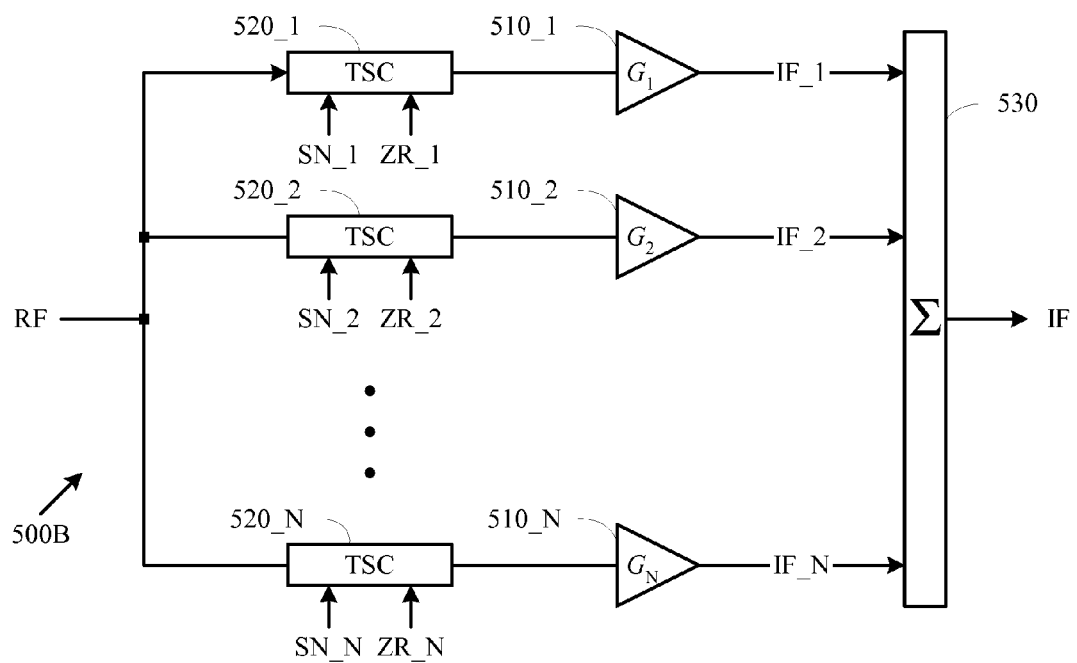
FIG. 5B shows an alternative embodiment of a frequency converter using a plurality of TSC circuits.

In an embodiment shown in FIG. 5A, a harmonics rejection frequency converter 500A comprises a plurality of TSC-based frequency conversion paths, constructed in parallel to convert an input signal denoted by RF (radio frequency) into a plurality of conversion signals, and a summing circuit to sum up said conversion signals to yield an output signal denoted by IF (intermediate frequency). Each conversion path comprises a gain element, which scales the input signal RF by a gain factor, and a TSC circuit, which receives the scaled RF signal and converters the scaled RF signal into an intermediate output by performing a MLT-3 multiplication using two control signals. For instance, in a first conversion path, gain element 510_1 scales the input signal RF by a factor of $G_1$, resulting in a scaled RF signal RF_1, which is converted by TSC circuit 520_1 by effectively performing a MLT-3 multiplication based on two control signals SN_1 and ZR_1, resulting in an output IF_1 accordingly. The outputs from all TSC circuits are then summed using a summing circuit 530, resulting in the final output signal IF. Harmonics rejection can be achieved by properly choosing the gain factors ($G_1$, $G_2$, and so on) and the timings of all the control signals (SN_1, ZR_1, SN_2, ZR_2, and so on). In an alternative embodiment shown in FIG. 5B, the location of the gain element is swapped with the location of the TSC circuit for each conversion path. For instance, gain element 510_1 is swapped with TSC 520_1 in the first conversion path. It is obvious to those of ordinary skill in the art that the function of frequency converter 500B of FIG. 5B is equivalent to the function of the frequency converter 500A of FIG. 5A.

In a special case of particular interest, one uses three TSC circuits (i.e. N=3 for FIG. 5A or FIG. 5B); all three TSC circuits effectively implement a multiplication with a MLT-3 wave having a $T_1/T$ value of 1/3 (and also a $T_{-1}/T = 1/3$ and a $T_0/T = 1/6$). Their respective MLT-3 waves have exactly the same frequency (1/T) but different phases. The timing of the first MLT-3 wave (corresponding to the first TSC circuit 520_1) is earlier than the timing of the second MLT-3 wave (corresponding to the second TSC circuit 520_2) by an amount of τ. Also, the timing of the second MLT-3 wave is earlier than the timing of the third MLT-3 wave (corresponding to the third TSC circuit 520_N when N=3) by an amount of τ. Mathematically we may represent the three MLT-3 waves by $$M_1(t) = \frac{2\sqrt{3}}{\pi} \begin{pmatrix} \sin(\omega t + \omega \tau) - \frac{1}{5} \cdot \sin(5\omega t + 5\omega \tau) - \\ \frac{1}{7} \cdot \sin(7\omega t + 7\omega \tau) + \ldots \end{pmatrix}$$

$$M_2(t) = \frac{2\sqrt{3}}{\pi} \left( \sin(\omega t) - \frac{1}{5} \cdot \sin(5\omega t) - \frac{1}{7} \cdot \sin(7\omega t) + \ldots \right)$$

$$M_3(t) = \frac{2\sqrt{3}}{\pi} \begin{pmatrix} \sin(\omega t - \omega \tau) - \frac{1}{5} \cdot \sin(5\omega t - 5\omega \tau) - \\ \frac{1}{7} \cdot \sin(7\omega t - 7\omega \tau) + \ldots \end{pmatrix}$$

where $\omega = 2\pi/T$. By choosing $\tau = T/12$, i.e. $\tau = \pi/(6\omega)$, $G_2 = -2\cos(5\pi/6) \cdot G_1$, and $G_3 = G_1$, one obtains a composite wave, through a superposition of the three MLT-3 waves, represented by the following mathematical expression:

$$M(t) = G_1 M_1(t) + G_2 M_2(t) + G_3 M_3(t)$$

$$= \frac{2\sqrt{3} \, G_1}{\pi} \begin{pmatrix} \sin\left(\omega t + \frac{\pi}{6}\right) - \frac{1}{5} \cdot \sin\left(5\omega t + \frac{5\pi}{6}\right) - \\ \frac{1}{7} \cdot \sin\left(7\omega t + \frac{7\pi}{6}\right) + \ldots \end{pmatrix} -$$

-continued $$\frac{4\sqrt{3}\,G_1\cos\left(\frac{5\pi}{6}\right)}{\pi}\left(\sin(\omega t) - \frac{1}{5}\cdot\sin(5\omega t) - \frac{1}{7}\cdot\sin(7\omega t) + \ldots\right) +$$

$$\frac{2\sqrt{3}\,G_1}{\pi}\left(\sin\left(\omega t - \frac{\pi}{6}\right) - \frac{1}{5}\cdot\sin\left(5\omega t - \frac{5\pi}{6}\right) - \frac{1}{7}\cdot\sin\left(7\omega t \frac{7\pi}{6}\right) + \ldots\right)$$

$$= \frac{12G_1}{\pi}\sin(\omega t) + (11th\text{ and higher order harmonics})$$

Therefore, $5^{th}$ order and $7^{th}$ order harmonics are both eliminated, and the composite wave is spurious free until the $11^{th}$ harmonics.

Figure 6:
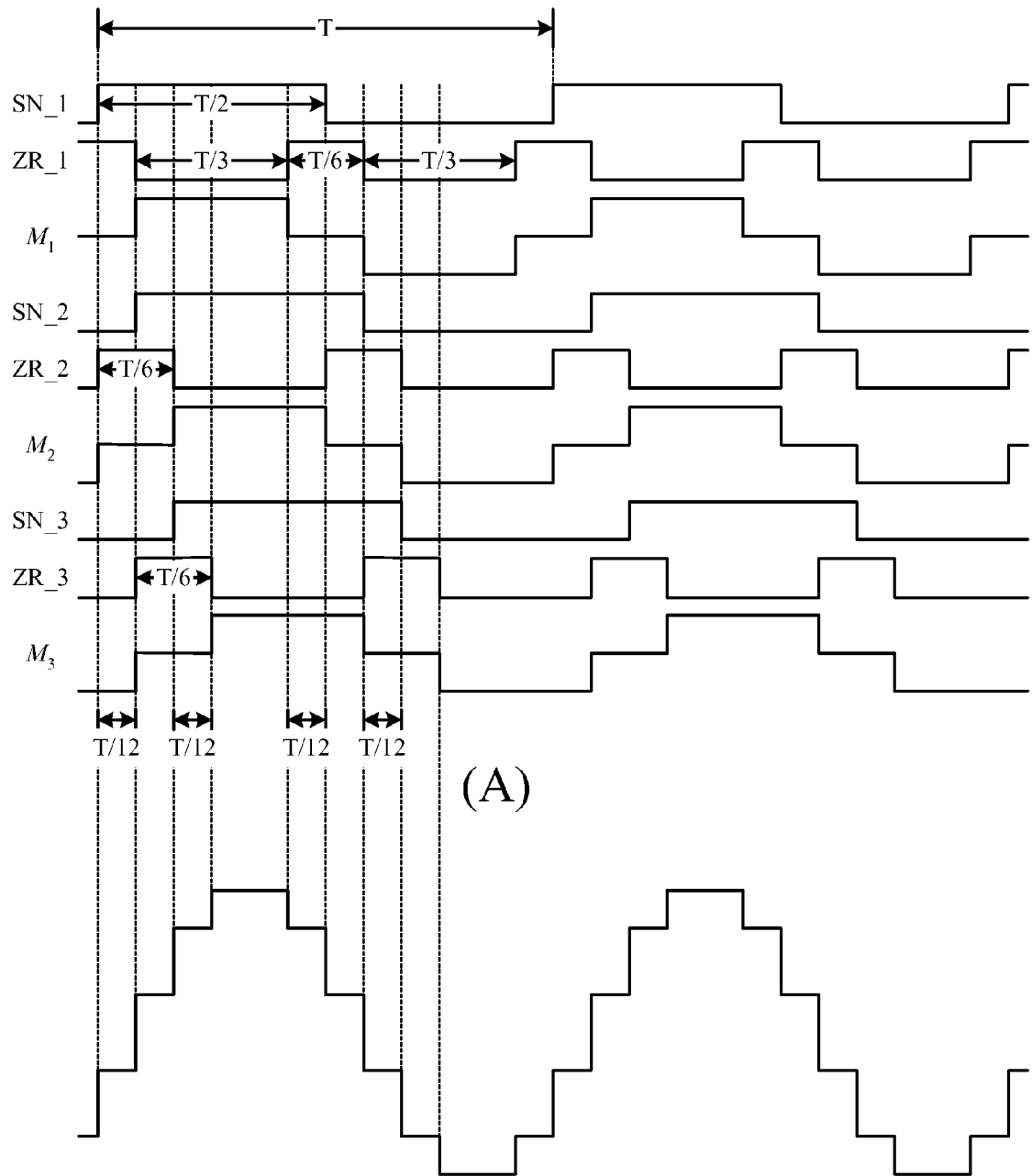
FIG. 6 shows a typical timing diagram of control signals and associated MLT-3 waves for the frequency converter of either FIG. 5A or FIG. 5B (A), and a composite waveform after a weighted sum (B).

An exemplary timing diagram for these three TSC circuits and their corresponding MLT-3 waves is shown in FIG. 6(A). All three "sign" controls (SN_1, SN_2, and SN_3) are square waves of period T with 50% duty cycle; however, their timings are spaced in a T/12 step, i.e. SN_2 has a delay of T/12 relative to SN_1, and SN_3 has a delay of T/12 relative to SN_2. All three "zero" controls (ZR_1, ZR_2, and ZR_3) are rectangular waves of period T/2 with ⅓ duty cycle (i.e. stay high for a duration of T/6 and then stay low for a duration of T/3 in each cycle); however, their timings are spaced in a T/12 step, i.e. ZR_2 has a delay of T/12 relative to ZR_1, and ZR_3 has a delay of T/12 relative to ZR_2. The respective MLT-3 waveforms for these three TSC circuits are depicted and labeled as $M_1$, $M_2$, $M_3$, respectively, as shown in FIG. 6(A). By scaling each MLT-3 signal with a respective gain and summing the scaled MLT-3 signals together, one can synthesize a waveform to approximate a sinusoidal wave, as shown in FIG. 6(B). Since the synthesized waveform is close to an ideal sinusoidal signal, the harmonics are greatly suppressed, compared to a square wave or a single MLT-3 wave. Note that the scaling is realized using a gain element associated with each TSC circuit; and the summing is realized using a summing circuit.

Figure 7:
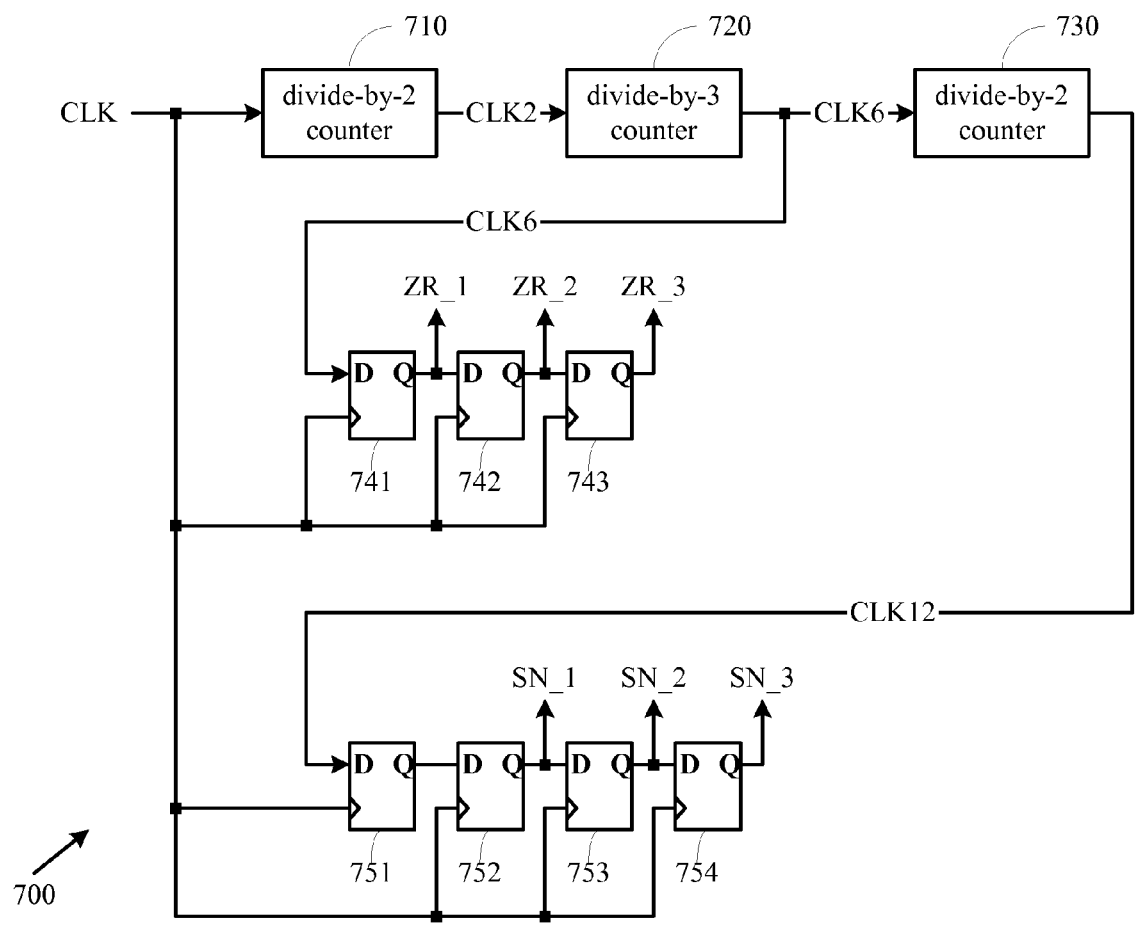
FIG. 7 shows an embodiment for generating the control signals shown in FIG. 6.

FIG. 7 shows an exemplary embodiment for generating the control signals needed for implementing the three MLT-3 waves shown in FIG. 6(A). A first clock CLK of period T/12 must be provided, say from a phase-lock-loop (PLL) circuit. A second clock CLK2 of period T/6 is derived from the first clock CLK using a first divide-by-2 counter 710. A third clock CLK6 of period T/2 is derived from the second clock CLK2 using a divide-by-3 counter 720. Note that the duty cycle of CLK6 is ⅓, because CLK6 is generated from a divide-by-3 counter; the reason is well understood in prior art and thus not explained here. A fourth clock CLK12 of period T is generated from the third clock CLK6 using a second divide-by-2 counter 730. Note that the duty cycle of CLK12 is ½, because CLK12 is generated from a divide-by-2 counter 730; the reason is well understood in prior art and thus not explained here. A first register array comprising DFF (data flip flop) 741, 742, and 743 is used to sample the third CLK6 at a rising edge of the first clock CLK, resulting in three "zero" signals, ZR_1, ZR_2, and ZR_3. As a result, the three "zero" signals have the same period of T/2 and the same duty cycle of ⅓ but have timings spaced in a step of T/12. A second register array comprising DFF (data flip flop) 751, 752, 753, and 754 is used to sample the fourth CLK12 at a rising edge of the first clock CLK, resulting in three "sign" signals, SN_1, SN_2, and SN_3. As a result, the three "sign" signals have the same period of T and the same duty cycle of ½ but have timings spaced in a step of T/12. Note that there is one more DFF (751) inserted in the second register array, therefore, the three "sign" signals have an extra delay of T/12 compared to the three "zero" signals. The detailed circuit embodiments of a data flip-flop, a divide-by-2 counter, and a divide-by-3 counter are well know to those of ordinary skill in the art and thus are not described here.

To summarize what has been disclosed thus far, a harmonic suppression frequency conversion can be fulfilled using a plurality of parallel TSC (tri-state chopper) circuits, each of which are controlled by two logical signals, to realize a plurality of parallel MLT-3 multiplications and then performing a weighted sum of all multiplication products. In particular, a MLT-3 waveform of $T_1 = T_{-1} = T/3$ and $T_0 = T/6$ has a highly desirable property of having zero $3^{rd}$ order harmonics, and a perfect harmonics rejection up to the $9^{th}$ order can be fulfilled using a weighted sum of three parallel MLT-3 multiplications of this particular MLT-3 waveform. In general, one may freely tailor a design by properly choosing a MLT-3 waveform, a number of parallel TSC circuits, and weights of each parallel multiplication, to achieve a desired composite waveform having a desired harmonics rejection.

Tri-State Chopper Based Direct Conversion Receiver

Figure 8:
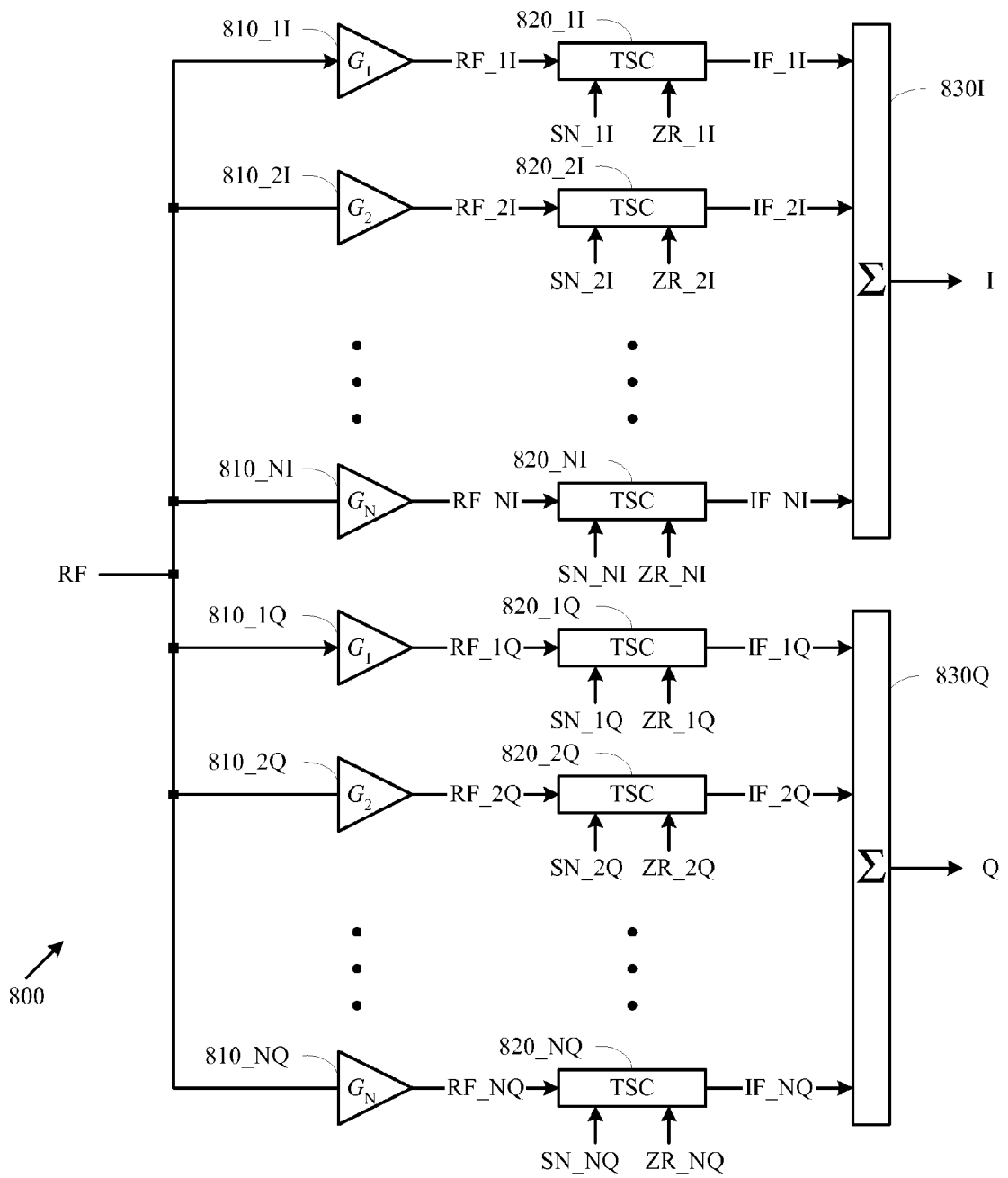
FIG. 8 shows an embodiment of a quadrature frequency converter using two groups of TSC circuits.

In a direct conversion receiver, a quadrature frequency converter comprising an in-phase (I) conversion path and a quadrature (Q) conversion path is needed. The principle of TSC based frequency conversion disclosed above can be easily extended to quadrature frequency conversion. A quadrature frequency converter using a plurality of TSC circuits is illustrated in FIG. 8. Here, an input signal RF is converted into an in-phase signal I using an in-phase conversion path and into a quadrature output signal Q using a quadrature conversion path. The in-phase conversion path comprises a first group of gain elements (810_1I, 810_2I, and so on), a first group of TSC circuits (820_1I, 820_2I, and so on) using a first group of control signals (SN_1I, ZR_1I, SN_2I, ZR_2I, and so on), and a first summing element 830I. The quadrature conversion path comprises a second group of gain elements (810_1Q, 810_2Q, and so on), a second group of TSC circuits (820_1Q, 820_2Q, and so on) using a second group of control signals (SN_1Q, ZR_1Q, SN_2Q, ZR_2Q, and so on), and a second summing element 830Q. All "sign" signals (SN_1I, SN_1Q, SN 2I, SN_2Q, and so on) must be periodic with the same period (say T). All "zero" signals (ZR_1I, ZR_1Q, ZR_2I, ZR_2Q, and so on) must also be periodic with the same period (say T/2). The quadrature conversion path has substantially the same circuit as the in-phase conversion path. The control signals for the quadrature conversion path (i.e. SN_1Q, ZR_1Q, SN_2Q, ZR_2Q, and so on) also have substantially the same waveforms as their respective counterparts in the in-phase conversion path (i.e. SN_1I, ZR_1I, SN_2I, ZR_2I, and so on); however, they must have a constant timing offset of approximately T/4 relative to their respective counterparts in the in-phase conversion path. For instance, SN_1Q has the same waveform as SN_1I but has a constant timing offset of T/4 relative to SN_1I, and ZR_1Q has the same waveform as ZR_1I but has a constant timing offset of T/4 relative to ZR_1I. In this manner, each TSC circuit effectively performs a MLT-3 multiplication, where the MLT-3 wave for any TSC circuit in the quadrature conversion path has a timing offset of T/4 relative to its counterpart in the in-phase conversion path.

Figure 9:
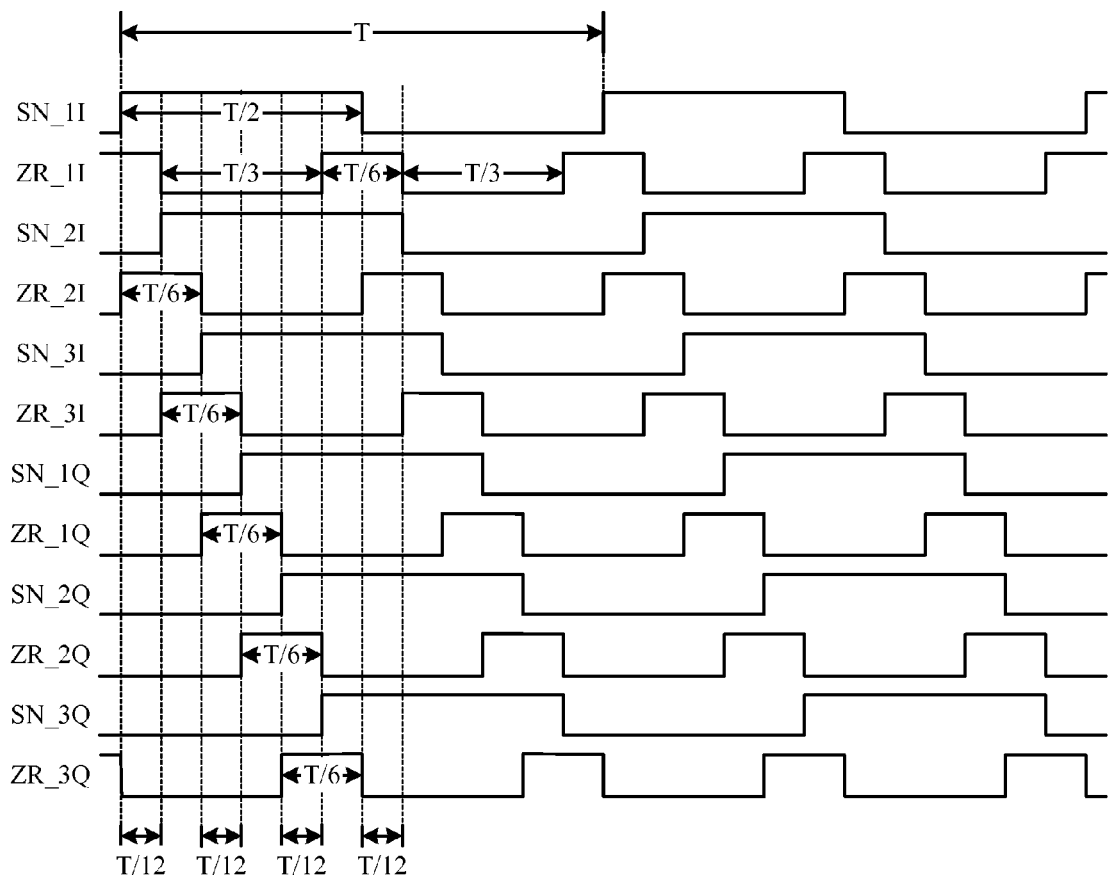
FIG. 9 shows a typical timing diagram of control signals for the quadrature frequency converter of FIG. 8.
Figure 10:
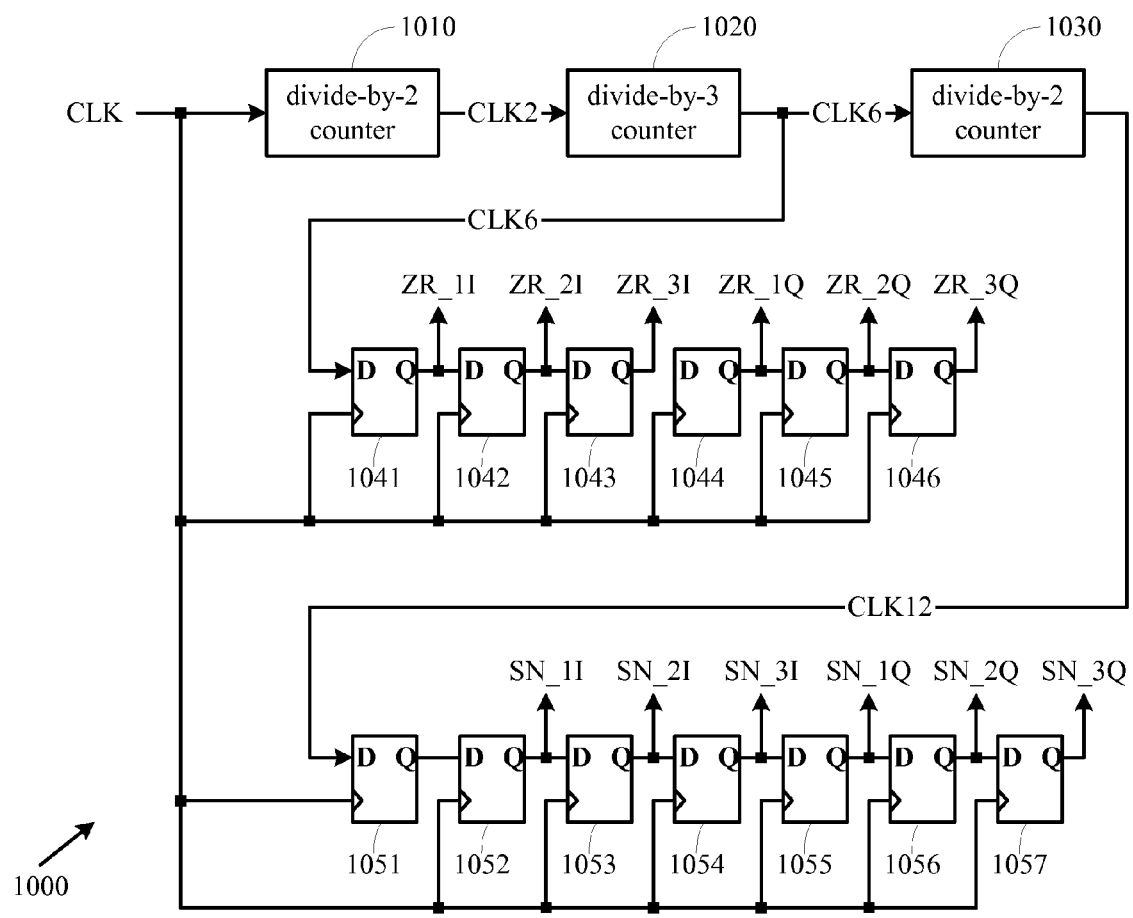
FIG. 10 shows an embodiment for generating the control signals shown in FIG. 9.

Again, a design of particular interest is to use three TSC circuits for each of both conversion paths and to use the same MLT-3 waveform that has $T_1/T = T_{-1}/T = ⅓$ and $T_0/T = ⅙$ for all TSC circuits. An exemplary timing diagram for such a scenario is depicted in FIG. 9. Here, all "sign" signals have the same period of T and the same duty cycle of ½, and all "zero" signals have the same period of T/2 and the same duty cycle of ⅓. SN_2I, SN_3I, SN_1Q, SN_2Q, and SN_3Q have a constant timing offset of T/12 relative to SN_1I, SN_2I, SN_3I, SN_1Q, and SN_2Q, respectively; and ZR_2I, ZR_3I, ZR_1Q, ZR_2Q, and ZR_3Q have a constant timing offset of T/12 relative to ZR_1I, ZR_2I, ZR_3I, ZR_1Q, and ZR_2Q, respectively. An exemplary circuit embodiment for generating those control signals is shown in FIG. 10, which is the same as that in FIG. 7 except for the following changes: three extra DFF (1044-1046) are added in the "zero" register array for generating the three "zero" control signals for the quadrature conversion path (i.e. ZR_1Q, ZR_2Q, and ZR_3Q), and also three extra DFF (1055-1057) are added in the "sign" register array for generating the three "sign" control signals for the quadrature conversion path (i.e. SN_1Q, SN_2Q, and SN_3Q). It is clear that, every control signal in the quadrature path has a timing delay of T/4 (which is the delay caused by three DFF stages when the period of CLK is T/12) relative its counter part in the in-phase path. For instance, ZR_1Q has a delay of T/4 relative to ZR_1I, and SN_1Q has a delay of T/4 relative to SN_1I.

Figure 11:
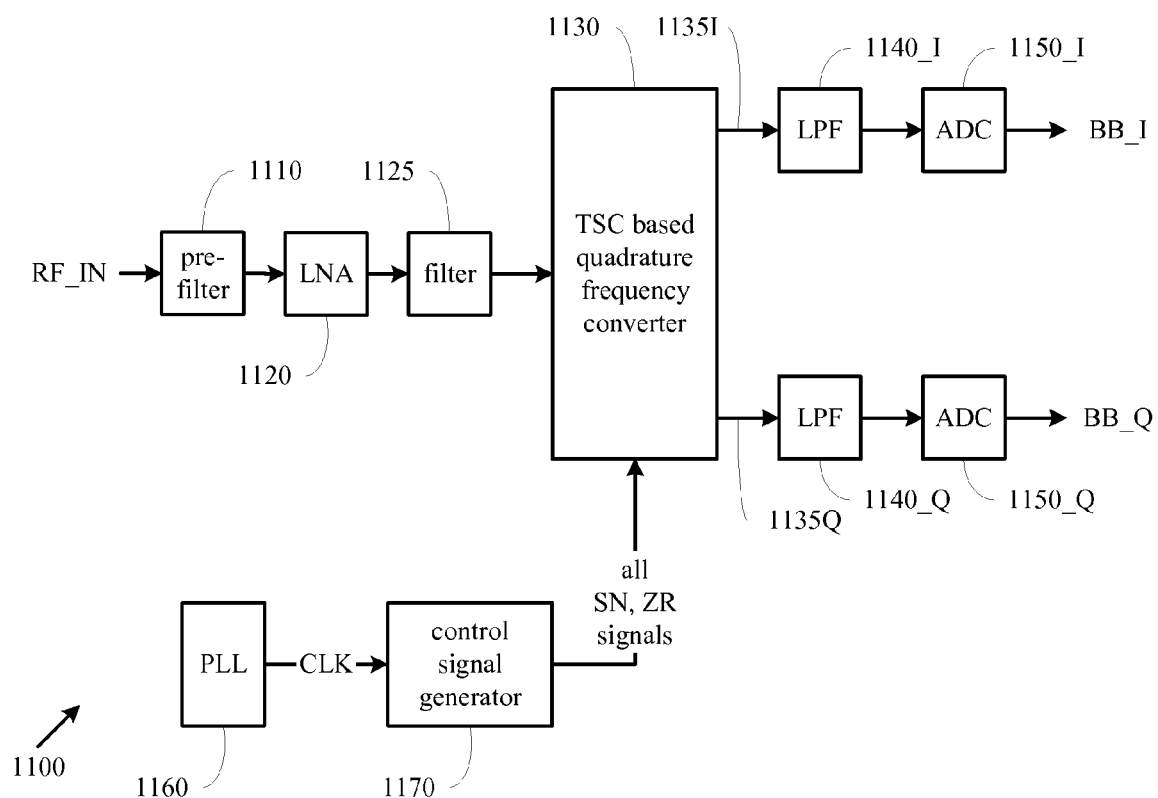
FIG. 11 shows a direct conversion receiver using a TSC based quadrature frequency converter.

A direct conversion receiver using a TSC based quadrature frequency converter is illustrated in FIG. 11. Here, receiver 1100 comprises an optional pre-filter 1110, a LNA (low noise amplifier) 1120, an optional filter 1125, a TSC based quadrature frequency converter 1130, an in-phase path comprising a first LPF (low pass filter) 1140_I and a first ADC (analog-digital converter) 1150_, a quadrature path comprising a second LPF 1140_Q and a second ADC 1150_Q, a PLL (phase lock loop) 1160, and a control signal generator 1170. An input signal RF_IN, received from for example an antenna, is filtered by the optional pre-filter 1110, then amplified by LNA 1120, then filtered by the optional filter 1125, and then converted into two signals 1135I and 1135Q using TSC based quadrature frequency converter 1130. The signal 1135I is filtered by LPF 1140_I and digitized into a first output signal BB_I using ADC 1150_I, while the signal 1135Q is filtered by LPF 1140_Q and digitized into a second output signal BB_Q using ADC 1150_Q. PLL 1160 is used to generate a clock signal CLK, whose frequency is for example 12 times as high as the frequency of the desired RF signal to be converted. The CLK signal is provided to control signal generator 1170 to generate a plurality of "sign" control signals (SN) and a plurality of "zero" control signals (ZR), for example using the circuit shown in FIG. 10. These SN and ZR signals are provided to the TSC based quadrature frequency converter 1130, which is embodied for example using the circuit shown in FIG. 8.

Alternative Embodiments

The principle disclosed by the current invention can be practiced in various forms. For example:

1. A gain element accompanying an associated TSC circuit (within a frequency conversion path) for effectively scaling an effective MLT-3 multiplication implied by the TSC circuit can be placed either before the TSC circuit or after the TSC circuit. For instance, gain stage 810_1I is placed before TSC 820_1I in FIG. 8, but can also be alternatively placed after TSC 820_1I. Although not absolutely necessary, it is highly desirable that the rest of the gain elements in FIG. 8 are also placed after their respective TSC circuits if gain element 810_1I is placed after TSC 820_1I (i.e., gain element 810_2I is placed after TSC 820_2I, gain element 810_1Q is placed after TSC 820_1Q, and so on) so that all parallel paths match well.

2. A gain element accompanying an associated TSC circuit (within a frequency conversion path) for effectively scaling an effective MLT-3 multiplication implied by the TSC circuit can be implemented using either a current-mode device (e.g. trans-conductance amplifier) or a voltage-mode device (e.g. operational amplifier).

3. A summing circuit for summing up all outputs from a plurality of TSC-based conversion paths can be implemented using either: (1) a direct tying of all outputs when all gain elements within said TSC-based conversion paths are implemented using current-mode devices, or (2) an operational amplifier when all gain elements within said TSC-based conversion paths are implemented using voltage-mode devices.

4. Instead of using a plurality of analog gain elements for implementing a plurality of "scaling" functions and an analog summing circuit for summing outputs from a plurality of conversion paths, one may choose to implement both the "scaling" and the "summing" function in a digital domain. In the digital domain embodiment: no analog gain elements are needed; an input RF signal is converted into a plurality of conversion signals by a plurality of TSC circuits, respectively; said conversion signals are filtered by a plurality of low pass filters, respectively; outputs from said low pass filters are digitized into a plurality of digital words by a plurality of analog-digital converters; said digital words are scaled by a plurality of digital gain elements, respectively, and summed together to generate a final output. Now refer to FIG. 11. When the "scaling" and the "summing" functions within the TSC-based quadrature frequency converter 1130 are implemented in the digital domain, signals 1135I and 1135Q are readily the final digitized baseband outputs, and therefore LPF 1140_I and 1140_Q and ADC 1150_I and 1150_Q must be removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency converter comprising a plurality of frequency conversion paths for receiving a common input signal and a plurality of periodic control signals and generating a plurality of conversion signals, respectively, and a summing circuit for summing all of said conversion signals to generate an output signal, wherein each of said frequency conversion paths comprises a tri-state chopper (TSC) circuit for receiving one of said periodic control signals and generating one of said conversion signals.

2. The frequency converter of claim 1, wherein for each of said conversion paths the respective conversion signal is proportional to the common input signal when the respective periodic control signal is in a first state, the conversion signal is proportional to an inversion of the common input signal when the respective periodic control signal is in a second state, and the conversion signal is set to zero when the respective periodic control signal is in a third state.

3. The frequency converter of claim 2, wherein for each of said conversion paths the respective conversion signal is embodied by a differential signal comprising a positive end and a negative end; wherein the conversion signal is set to zero by shorting the positive end of the conversion signal with the negative end of the conversion signal.

4. The frequency converter of claim 1, wherein the TSC circuit has a flexibility of a selective harmonics rejection.

5. The frequency converter of claim 1, wherein: the input signal is embodied by a differential signal comprising a positive end and a negative end; and for each of said conversion paths the respective conversion signal is also embodied by a differential signal comprising a positive end and a negative end.

6. The frequency converter of claim 1, wherein for each of said conversion paths the respective periodic control signal is encoded by a first binary signal and a second binary signal.

7. The frequency converter of claim 6, wherein the TSC circuit within each of said frequency conversion paths comprises a first group of switches and a second group of switches.

8. The frequency converter of claim 7, wherein the first group of switches are controlled by the first binary signal and the second group of switches are controlled by the second binary signal.

9. The frequency converter of claim 1, wherein said periodic control signals have the same period but different timings.

10. The frequency converter of claim 1, wherein at least one periodic control signal is encoded by a first binary signal and a second binary signal.

11. The frequency converter of claim 10, wherein the first binary signal has a period T and the second binary signal has a period of half of T.

12. The frequency converter of claim 10, wherein a period of the first binary signal is proportional to a period of the second binary signal.

13. A frequency converter comprising:
a first frequency converter comprising: a first group of parallel conversion paths for receiving an input signal and a first group of periodic ternary signals and converting the input signal into a first group of conversion signals, and a first summing circuit for summing the first group of conversion signals to generate a first output signal; and
a second frequency converter comprising: a second group of parallel conversion paths for receiving the input signal and a second group of periodic ternary signals and converting the input signal into a second group of conversion signals, and a second summing circuit for summing the second group of conversion signals to generate a second output signal.

14. The frequency converter of claim 13, wherein all ternary signals in the first group of periodic ternary signals and all ternary signals in the second group of periodic ternary signals have the same period but different timings.

15. The frequency converter of claim 14, wherein each conversion path in the first group of parallel conversion paths further comprises a gain element, and also each conversion path in the second group of parallel conversion paths further comprises a gain element.

16. The frequency converter of claim 13, wherein the second frequency converter has substantially the same circuit as the first frequency converter.

17. The frequency converter of claim 13, wherein the second group of periodic ternary signals have substantially the same waveforms as the first group of periodic ternary signals but have a fixed timing offset.

18. A method of performing frequency conversion, the method comprising:
receiving an input signal and a plurality of periodic ternary signals of the same frequency but different timings;
generating a plurality of conversion signals using a plurality of conversion paths in response to the input signal and states of said periodic ternary signals; and
summing the conversion signals to generate an output signal.

19. The method of claim 18, wherein for each of said conversion paths: the corresponding conversion signal is proportional to the input signal when its corresponding periodic ternary signal is in a first state; the corresponding conversion signal is proportional to an inversion of the input signal when its corresponding periodic ternary signal is in a second state; and the corresponding conversion signal is set to zero when its corresponding periodic ternary signal is in a third state.

20. The method of claim 18, wherein at least one periodic ternary signal is encoded by a first binary signal and a second binary signal.

* * * * *